(12) United States Patent
Daniel et al.

(10) Patent No.: US 10,447,042 B2
(45) Date of Patent: Oct. 15, 2019

(54) SYSTEMS AND METHODS FOR BATTERY ASSEMBLIES

(71) Applicant: MOIXA ENERGY HOLDINGS LIMITED, London (GB)

(72) Inventors: Simon Richard Daniel, London (GB); Christopher Verity Wright, Gloucestershire (GB)

(73) Assignee: MOIXA ENERGY HOLDINGS LIMITED, London (GB)

( * ) Notice: Subject to any disclaimer, the term of this patent is extended or adjusted under 35 U.S.C. 154(b) by 0 days.

(21) Appl. No.: 15/191,034

(22) Filed: Jun. 23, 2016

(65) Prior Publication Data

US 2016/0301213 A1 Oct. 13, 2016

Related U.S. Application Data

(63) Continuation of application No. 14/096,511, filed on Dec. 4, 2013, now Pat. No. 9,379,545.

(51) Int. Cl.
| | |
|---|---|
| *H02J 7/00* | (2006.01) |
| *H02J 3/38* | (2006.01) |
| *H02J 1/14* | (2006.01) |
| *H05K 13/00* | (2006.01) |
| *H02J 13/00* | (2006.01) |
| *H02J 3/00* | (2006.01) |

(52) U.S. Cl.
CPC ............ *H02J 3/381* (2013.01); *H02J 1/14* (2013.01); *H02J 3/005* (2013.01); *H02J 7/0024* (2013.01); *H02J 13/0096* (2013.01); *H05K 13/00* (2013.01); *Y02B 10/14* (2013.01); *Y02E 40/72* (2013.01); *Y04S 10/12* (2013.01); *Y10T 29/49117* (2015.01); *Y10T 307/352* (2015.04); *Y10T 307/50* (2015.04)

(58) Field of Classification Search
CPC .... Y02E 60/12; G01R 31/3658; H02J 7/0021; H02J 7/0016; Y02T 10/7055
USPC .......................................................... 320/116
See application file for complete search history.

(56) References Cited

U.S. PATENT DOCUMENTS

| | | | | |
|---|---|---|---|---|
| 2002/0138785 A1* | 9/2002 | Hammond | ................ | H02J 9/00 714/14 |
| 2003/0050801 A1* | 3/2003 | Ries | ...................... | G06F 19/327 705/2 |
| 2004/0170262 A1* | 9/2004 | Ohno | ................... | H04L 12/2803 379/167.12 |
| 2004/0205152 A1* | 10/2004 | Yasuda | ............. | G06F 17/30212 709/217 |
| 2006/0145662 A1* | 7/2006 | Huang | .................. | H02J 7/0016 320/116 |
| 2007/0033566 A1* | 2/2007 | Weber | ................. | H04L 67/1097 716/51 |
| 2007/0143505 A1* | 6/2007 | Terrell, II | ............... | G06F 1/266 710/10 |

(Continued)

*Primary Examiner* — Arun C Williams
(74) *Attorney, Agent, or Firm* — Conley Rose, P.C.

(57) ABSTRACT

A system including a plurality of battery assemblies. Each battery assembly includes power storage and control electronics, and a communication device. Each battery assembly acts as a local hub for local direct current (DC) power demand monitoring and a local DC power supply for DC loads. Each battery assembly also charges the power storage. The plurality of battery assemblies are configured to be managed as a collective resource in aggregate via the communication device.

21 Claims, 8 Drawing Sheets

(56) References Cited

U.S. PATENT DOCUMENTS

| | | | |
|---|---|---|---|
| 2010/0017045 A1* | 1/2010 | Nesler | B60L 11/1824 700/296 |
| 2010/0264739 A1* | 10/2010 | Errington | H02J 1/10 307/80 |
| 2012/0228946 A1* | 9/2012 | Sim | H01M 2/024 307/80 |

* cited by examiner

SYSTEMS AND METHODS FOR BATTERY ASSEMBLIES

CROSS-REFERENCE TO RELATED APPLICATION

The present application is a continuation of U.S. Nonprovisional patent application Ser. No. 14/096,511 filed Dec. 4, 2013, which claims priority to United Kingdom Patent Application No. 1221819.4, filed on Dec. 4, 2012, both of which are incorporated herein by reference in their entirety.

BACKGROUND

The present disclosure relates generally to distributed smart battery systems co-located with end user demand, to provide optimized local electricity supply and demand management services for network participants, and specifically for a smart battery management system and assembly comprising electrical storage, smart control and local DC (Direct current) supply to local DC lighting and DC electronics demand, charging intelligently from grid resources, on demand or leveraging local renewable DC supplies. And where networks of said distributed systems provide in aggregate a large battery resource capable of supporting grid storage services or providing smart demand management services for network or local network needs.

Various prior technologies have been deployed centrally or in bulk, for grid management and balancing, such as long established pumped hydro—storing excess energy, peak shaving or use on demand, and various technologies are emerging from electrochemical storage to air pressure or thermal differential storage systems. However, few edge of network, battery or chemical storage technologies and approaches have been deployed for balancing grid requirements, other than heat storage systems for consumer heating demands. A major limiting factor is the costs and life-cycle limits on electrochemical storage, the lack of overall smart systems to manage their aggregated deployment, the lack of optimal reasons for locating such storage in customer premises, and lack of suitably designed or low cost apparatus, devices and approaches for deploying such systems.

In U.S. Pat. Pub. 2010/0076615, an earlier patent application by MOIXA inventors, various innovations on power electronics, energy use data, DC-DC micro-grids and integrating micro-renewables and smart variable DC sockets were disclosed. The present application builds on in more detail in relation to smart battery systems, detailed assemblies, and systems used in aggregate for network services.

A critical problem and opportunity, is therefore in distributed battery system innovations, such as integration and design of suitable apparatus capable of mass market deployment, suitable methods and approaches for leveraging local battery storage for optimal charge and discharge algorithms for daily power needs, optimal electronics and power delivery mechanisms that facilitate efficient electrical power delivery, smart control and data support for local electricity demand side monitoring, suitable control to optimize use, commercial deployment and partnership approaches, and systems and services to provide such resources and facilitate aggregate demand side management and grid balancing opportunities.

SUMMARY

According to a first aspect of the present disclosure, there is provided a system comprising a plurality of battery assemblies, wherein each battery assembly: comprises power storage and control electronics and communication device; and, is configured to: act as: a local hub for local DC power demand monitoring; and, a local DC power supply for DC loads; charge the power storage; wherein the plurality of battery assemblies are configured to be managed as a collective resource in aggregate via the said communication device. As used herein, the term communication device refers to a hardware device that enables data communication with another entity, such as a remote computer, using a communication protocol. For example, a communication device may be a network interface card (NIC), a wireless communication device such as a Wi-Fi adapter or a cellular (e.g., 3GSM) card, or other similar device.

The system may be configured such that the plurality of battery assemblies is a network of battery assemblies providing an aggregate battery or as clusters capable of supporting grid storage services or providing demand management services.

The system may be configured such that the control device comprises an algorithm for charging and/or DC power demand management.

The system may be configured such that at least one battery assembly is capable of receiving a demand management signal or demand request.

The system may be configured to receive the demand management signal from a smart meter, where said smart meter is connected remotely to a third party service.

The system may be configured to schedule the charging of the batteries assemblies in accordance with a demand from local end users.

The system may be configured to schedule the charging of the battery assemblies based on power usage measurements.

The system may be configured such that the charging is further scheduled dependent upon the availability of power generation resources.

The system may be configured such that the charging is further scheduled dependent upon the export of power from power generation resources.

The system may be configured such that the said power generation resources comprise any of:
I) photovoltaic resources;
II) wind generation
III) fuel cells;
IV) combined heat power electrical generation;
V) building fabric technology capable of generating DC power
VI) DC scavenging technologies.

The system may be configured such that the power storage charging and supply of DC power is scheduled based on a demand from a third party service.

The system may be configured to only supply power to a subset of connected DC loads.

The system may be configured to:
I) determine the profile and type of end device power usage; and,
II) manage the said end device.

The system may be configured such that determining the profile and type of end power usage comprises using USB power delivery via a DC socket.

The system may be configured such that managing the said end device comprises any of:
I) report maximum and minimum power load, or
II) switch off or put the end device into standby when not used, or
III) defer the charging of a battery on said end device.

The system may be configured to detect a cluster of end power use and correlate power supply activities across associated power sockets.

The system may be configured to:
I) be connected to a series of DC sockets;
II) receive power usage data from the series of DC sockets
III) determine when an end device and a connected peripheral device are in use;
IV) switch off the DC power or switch to standby the peripheral device when the end device is not in use The system may be configured to supply DC power to any one or more of:
I) a DC socket;
II) a lighting circuit;
III) a micro-inverter AC resource.

The system may be configured to control the power export of a connected Photovoltaic resource.

The system may be configured such that the battery assemblies collectively form a shared DC bus or spine to power multiple DC circuits.

According to a second aspect of the present disclosure there is provided a method of installing a system as described in the first aspect of the disclosure, in any of the configurations described above, the method comprising the steps of: co-locating a battery assembly near an energy meter and consumer unit; connecting the battery assembly to re-use existing lighting circuit wiring.

The method may further comprise the step of disconnecting an existing sub circuit.

The method may further comprise the step of connecting an additional sub circuit to the said battery assembly.

The method may further comprise the step of connecting a DC socket to the said battery assembly.

The method may further comprise the step of connecting the said battery assembly to a local DC power supply.

According to a third aspect of the present disclosure there is provided a battery assembly configured: for use in a distributed battery system comprising a plurality of further battery assemblies; and, to receive electrical power from a power source; the battery assembly comprising: electrical power storage to store power from the power source; power electronics for delivering electrical DC power to a sub circuit; control electronics and communication device configured to: receive data associated with: energy usage and/or, a management signal from a remote third party; and, charge the electrical power storage and/or optimise DC power delivery, based on the said received data.

The battery assembly may be configured to receive a demand management signal or demand request from a smart meter, where said smart meter is connected remotely to a third party service.

The battery assembly may be configured such that the communication device is configured to connect to a third party service.

The battery assembly may comprise an expansion interface board for receiving sensor data.

The battery assembly may be configured such that the communication device and control electronics are configured to manage local thermal and heating sources.

The battery assembly may be configured such that the storage and control electronics are separable into front and rear frame units respectively.

The battery assembly may be configured to be modular in nature to allow any of: adaption or extension with additional communication or control boards, increasing the capacity of a battery pack, replacing batteries, or connecting alternate battery packs.

According to a fourth aspect of the present disclosure there is provided a method of installing a battery assembly as described in the third aspect, in any of the configurations described above, comprising the step of connecting existing lighting circuit wiring to the battery assembly.

According to a fifth aspect of the present disclosure there is provided an electrical power socket for providing DC power, the socket comprising: power circuitry for receiving DC power from a supply circuit; and, means for recognising power delivery requirements; wherein said power circuitry is configured to perform DC-DC power conversion in accordance with the recognized power requirement.

The electrical power socket may be configured such that the socket is configured to support USB power delivery.

A general object of the preferred embodiments is to provide a smart battery system assembly, for installation in customer premises, such as by a consumer unit or smart meter, to directly power various DC circuits in the building for lighting and DC appliance or computing loads, where said smart battery assembly, typically comprises of; electrical power storage via electrochemical battery or other means; smart control electronics and connectivity; power electronics for integrating local power supplies, such as AC mains, local generation e.g. petrol or diesel fuel based, or local DC supplies, typically being some of solar PV supplies, fuel-cells or CHP (Combined Heat Power) electrical generation or energy scavenging and building fabric technology capable of generating DC power; power electronics for providing suitable voltages onto a DC bus and connected DC circuits and sub-circuits; mechanical frames and assemblies suitable to enable attachment to walls and mounting of a variety of different types and sizes of battery unit; local displays and control panels such as LED units and displays; local switchgear or fuse mechanisms.

In a preferred embodiment said assembly provides storage co-located with the meter, or meter attached storage (MAS), and said connectivity is capable of receiving a demand management signal or demand request from a smart meter, where said smart meter is itself connected remotely to third party services. In an alternate preferred embodiment said assembly supports its own communication device, such as a wireless communications device, for example 3GSM card, which provides mobile connectivity, to enable some of remote management, status 'pulse' or health check data, basic data exchange, receiving a demand management signal, acknowledging and responding to a demand management signal, software maintenance and software upgrades, mechanical and systems maintenance such as reporting end of life or degradation of battery performance. In a preferred embodiment a local wired connection such as an RS232 port or Ethernet could be used to connect to local smart hubs, routers, wireless hubs or custom supplier interfaces, which themselves provide connection and services triggered remotely. In a preferred embodiment said apparatus could support local wireless communication over Wi-Fi or ZigBee, to receive status, alerts, or energy use data from appliances, switches or third-party installed devices, or provide smart control triggers or demand reduction, or simply to help automate and allow scheduled or real-time user control and energy displays and feedback on consumer devices such as web pages, smartphones or digital televisions or other household energy displays. In preferred embodiments local clamps could be connected to smart meters, circuits, or export meters from renewable generation, to measure usage and determine when circuits are in use or energy is in surplus and exported back to the grid.

In a preferred embodiment said connectivity enables the smart control to receive data and track detailed DC usage at the system level, at the light-circuit level e.g. via local smart control units connected in the light circuit, or DC usage at the smart DC socket level, and to optionally track end appliance details via enumeration and other reporting means, to enable smart decision logic in charging the battery resources based on such actual usage measurements. Similarly said data could be used to optimize the overall power delivery, or for safety and limiting appliance use above certain ranges or detecting anomalies. In a preferred embodiment said smart battery assembly can support an expansion Interface board for more advanced monitoring of other electrical appliances and sensor data such as $CO_2$, temperature, gas and water meter usage, sensors across building.

In a preferred embodiment said connectivity and smart control could be used to manage local thermal and heating resources, such as heat storage, or directly manage and shift demand in smart appliances, or on retrofit apparatus devices attached to appliances to make them accessible for smart management.

Taken together said smart control could be used to manage both the optimal storage of electrical power in the battery, to specific tariff plans that optimize or minimize certain parameters, such as minimizing peak period energy consumption by pre-charging to provide power to DC loads during peak period, or used to shift high load device running on the AC ring mains, such as white goods or appliances to off peak times. Similarly charging and device running could be scheduled or aligned based on export of local renewable sources, or moved on demand from third party services, such as at times of grid supply issue, or to take advantage of low carbon resources, or online renewable resources such as wind.

In a preferred embodiment, networks of such smart battery assemblies, could be installed in a local cluster on distribution network, or feeder, or substation network, and be managed as a collective resource in aggregate to provide local LV or network benefits. An example deployment could for example charge all batteries at an off-peak time, in accordance with expected demands by local end users for corresponding peak periods (typically an evening 5-10 pm or 7-8 pm period). An example preferred deployment could couple this scheduled demand requirement with local distributed generation resources such as wind, to either charge at off peak time or on availability of such low carbon intensity power supply, or to maximize using such power generated off peak for powering peak load demand. At the edge level, such renewable resources could be on-site PV panels or other DC generation or scavenging technologies, and use a local DC-DC network rather than inverters thus avoiding certain power conversion losses, though for some deployments it may be easier on wiring and installation or for regulatory means and access to tariffs to use inverted AC energy for metering purposes. When coupled with larger generators such as neighbourhood resources, waste to energy, PV arrays or wind, such a method allows end users to directly benefit from such resources, by using power at more appropriate times. In a similar way emergency generators or back-up generators could be used to provide energy at specific times to power a network of batteries. At a large site such as apartment block, hotel, or leisure park or temporal military base, such a combination of local generators and distributed storage, allows maximizing local resources. Similarly said resources could be aggregated across different parts of a network.

A further preferred object of the preferred embodiments is to allow more complicated twinning or coupling of larger distributed energy resources such as wind farms, whereby the network of potential storage is allocated preferentially to leverage wind supply, to overall allow a coupled demand in charging batteries to reduce the portion of time when wind might need to be curtailed, or to make it easier upfront to gain a connection onto the Low voltage distribution network, by such linkage and managed coupled demand. This has particular benefits on networks with a larger proportion of weather dependent or metrological generation sources, as reduces volatility and improves security of supply, by enabling greater time shifting of supply with evening or other day time demand.

It is a preferred object of the preferred embodiments that such an overall system can act to provide energy security and resilience in the event of power cuts or network failure, since the stored battery power could still be used on a local DC-DC network, as would be isolated from the grid, to enable continuity of essential LOW power DC circuits for lighting, electronics, media, audio-visual, communication, security. Hence such systems act as a MAS-LOW meeting key energy needs, from meter attached storage powering low power electronics and lighting demands, and enabling security as well as grid-shift resources.

In a major disaster, such as flooding (as occurred following hurricanes in US) or excess rain and storms in Europe, or in grid infrastructure failings in India, large numbers of deployed systems could both help avoid grid failure, by reducing peak demand systemically, as well as provide continuity of service from stored energy, or continuously with suitably installed local renewable resources, or on emergency connection of local generation sources, such as fuel based generators. Similarly such systems could reduce demand by only enabling power to a subset of connected DC loads by smart control or priority releases.

In a further preferred embodiment, said control systems and data connectivity, could determine the profile and type of end device power usage, through measurement, historic monitoring, or through direct enumeration of end appliances using emergent standards such as USB Power Delivery, and also to manage suitable device and system level policies and preferences, such as the ability to report up maximum and minimum power load, ability to switch off or put devices into standby when not used, or to defer battery charging of end consumer or computing devices with inherent storage, either through device, user, building, or system level policies and permissions, including how data and privacy is managed. Some smart control approaches could be inferred, e.g. detecting clusters of end power use and correlating activities across nearby power sockets. For example a series of DC sockets could report their usage, and enable a central system to notice when a laptop and connected peripherals are in use (e.g. monitors, printers, gadgets), and switch off the power or switch to standby those devices when the laptop or computer is not in use. Similarly said usage enables a central system to optimize other systems, such as thermostats and heating, or lighting use.

In aggregate networks of smart battery systems, may aggregate overall DC demands and be able to manage building or network level demand requirements, by shifting when DC devices are charged where charging could be deferred, this together with the actual battery resources installed in the system, enables a larger aggregate storage network to be managed and provide demand shiftable inventory for network participants.

It is a further object of the preferred embodiments that said smart battery systems are coupled with DC-DC networks, typically by means of DIN rail mounting suitable connectors and switchgear—and where said circuits use lighting or other dedicated circuits in a property to power DC lighting units, which could be DC LEDs or DC CFLs or other DC light devices, or local micro-inverter AC resources where required (e.g. shaver socket) and provide smart DC sockets, capable of performing DC-DC power conversion in response to a smart plug. In a preferred embodiment said DC sockets is a universal power socket such as supporting USB Power Delivery standard, where a wider range of voltages can be requested, typically through enumeration of the end device and the socket acting as a host, or via chips and circuitry in the cable or connector plug itself, to draw the appropriate voltage, and be able to report and exchange data on end device type, power requirement and policy for energy management or other related demand side availability or privacy permissions.

Said DC sockets typically forming separate units, wall sockets or hubs for mounting in work-areas, media areas, or embedded in suitable furniture. Where said DC sockets in a preferred embodiment use USB power delivery to identify and supply suitable voltage requirements for end user loads, and enable measurement and reporting of such requirements upstream. Said DC sockets in preferred embodiments being capable of receiving power from a local AC/DC supply or a local DC-DC supply, such as a renewable resource or network DC supply over a circuit. Said DC sockets in preferred embodiments supporting communication device such as ZigBee or wireless of over wire high frequency signals.

In such preferred embodiments, said overall smart battery assembly therefore provides a key network node, or user hub for aggregating in building DC demands at the device level from a plurality of sensors or DC sockets, and optimizing there overall use, optimally providing power delivery through a DC-DC network and DC socket, and managing the overall demand in line with power supply from the batteries or from grid or other renewable resources.

Said overall systems together with smart tariffs enable households to reduce overall energy user through a combination of energy reduction opportunities, such as using DC LED lighting rather than mains AC incandescent, or using low power DC appliances, avoiding AC/DC and inverter losses, and using power for such DC demands at the lowest price or carbon times. Said overall systems enabling utility providers to establish smart tariffs that trigger suitable battery storage, and reduce overall peak period consumption, whilst reducing bill increases to consumers, where said utilities benefit by reduced wholesale peak period energy consumption and purchase, together with reduced volatility in demand and improved forecasting.

Said overall systems, enabling local networks to leverage battery resources on demand for local infrastructure or upgrade mitigation, such as reducing or shifting demand, or balancing EV or heat pump demand, or leveraging excess local clustering and supply of PV export. Said overall systems enabling local and larger scale distributed energy resources to mitigate excess production, gain reliable energy connection, and ensure energy supply is better balanced with demand. Said overall systems enabling novel and unique smart tariffs, optimizing time of use, time of supply, carbon or other objectives. Said overall systems enabling optimizing energy resilience at times of network failure, by keeping online or prioritizing essential DC demand requirements in line with stored energy or knowledge of availability of local DC generation supplies. Said overall system taken collectively enabling an assured peak reduction at peak period to reduce overall investment or infrastructure upgrade requirements of national network or national generation requirements.

Said overall system collectively reducing power factor and other AC/DC power losses, as well as reducing harmonic noise by negating the need for numerous power conversion and power adaptors throughout the system. Said overall system being better at accommodating the rising electricity demand profiles by end users which are increasingly locally DC based in ICT, computing, communication, gaming, LED lighting, battery operated devices, Electric Vehicles.

Said overall system providing an optimal blend of leveraging local DC resources and building fabric for local DC demands.

Said overall system also providing suitable control and management services for wirelessly connected high load AC devices such as smart appliances or retrofit appliances.

Said overall system being capable in aggregate of dimming or turning off large networks of LED lighting distributed across the system, or shifting demand from DC devices that are partly charged over a minimal required threshold or permission.

Said overall system being capable of rapid deployment by retrofit and electrical installer, co-locating near meter and consumer unit and disconnecting certain existing sub-circuits used currently lighting and connecting extra sub-circuits where required, together with changing existing lighting on said circuits to DC lighting devices or drivers, and adding in suitable DC sockets where required, or connecting to local DC supplies where available.

Said system learning through operation, to further identify opportunities for additional circuits to be converted to DC, or appliances changed, by correlating current DC demand detail with inferred AC Demand detail, or heating parameters of the building, and targeting suitable advice and messaging to operators or end users Said overall system and assembly being modular in nature to allow adaption or extension with additional communication or control boards, or increasing the capacity of battery packs, replacing batteries with new or alternate chemistries or connecting alternate battery packs.

Said systems being configurable in parallel enabling multiple systems to collectively form a shared DC bus or spine, to power multiple circuits in larger premises.

Said systems supporting electronic control for monitoring safety, circuit breaks, fusing, short circuits and other fault modes, at the component or central layer, and switching off power as required. Said overall system being isolated from grid to enable on-going operation in compliance with local rules and disconnection of any power supplied back to the grid.

Said systems being deployable in isolation with renewables to provide DC power systems for lighting and electronics, or enabling small scale solar installations in urban areas, where a few panels are used to power battery packs, for local DC lighting and electronics.

BRIEF DESCRIPTION OF THE DRAWINGS

For a detailed description of exemplary embodiments of the disclosure, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections.

Detailed Description

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
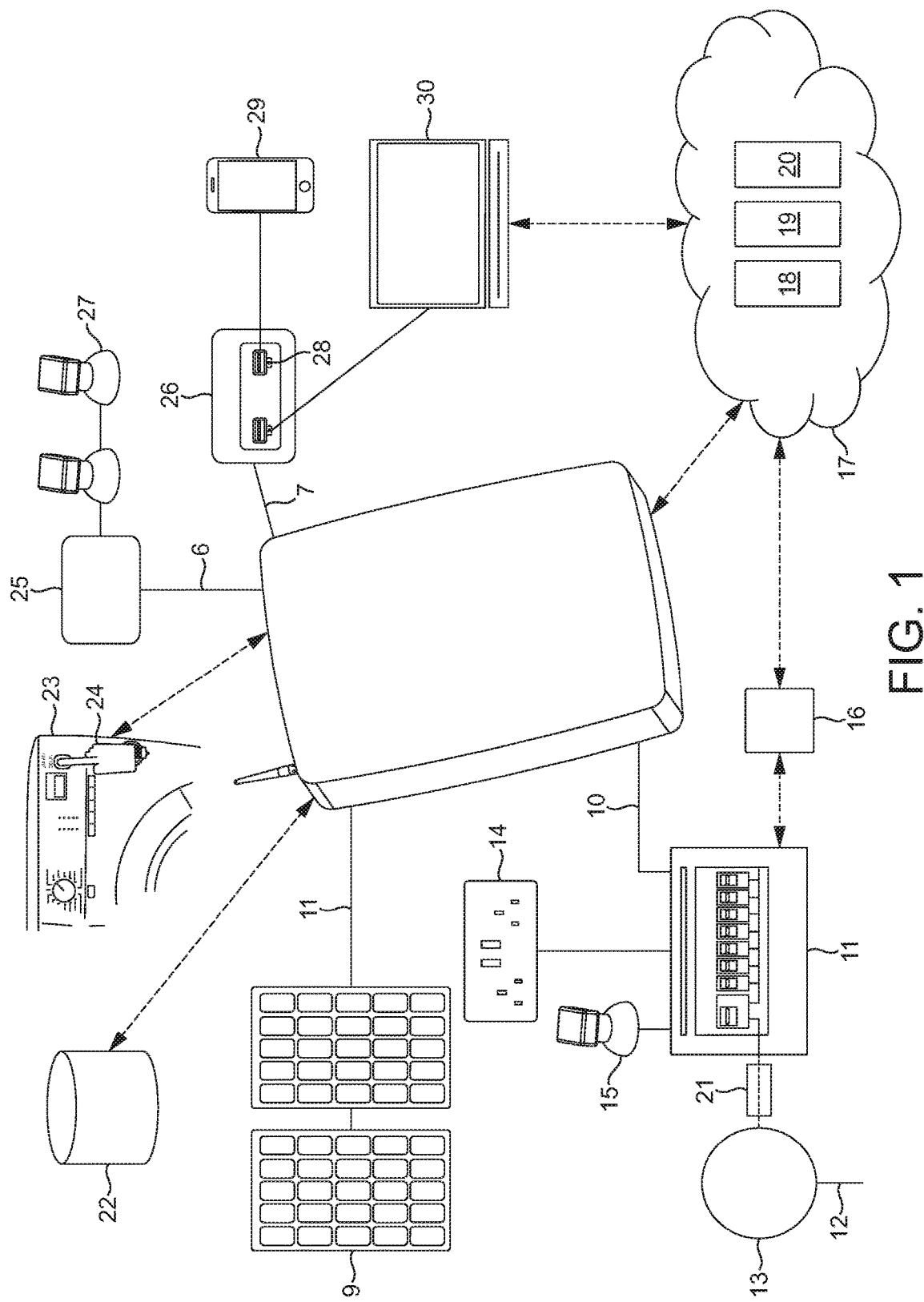
FIG. 1 illustrates a high-level schematic of elements of the system, comprising a smart battery assembly providing power local DC circuits, illustrated as lighting for LED and smart DC sockets for consumer devices, and receiving power from local DC supplies, such as PV panels, or from AC mains, and in communication with local household or building devices such as meters, heating systems, smart appliances or appliances made smart through retrofit means, or in connection with local smart hubs or other control networks, and where said smart battery assembly is in communication device with remote services to support making smart control decisions, or triggering demand reduction requirements.

Referring to FIG. 1, which shows a high level schematic of elements of distributed battery system to provide efficient local electricity supply and demand management services for network participants, comprising a smart battery assembly (1) where a mechanical frame assembly (2) contains electrical storage (3), smart control (4), connectivity means (5), capable of delivering electrical DC power to a plurality of sub-circuits indicated here as lighting (6) and DC circuits (7), or optionally to a micro-inverter, and is capable of receiving power from a range of sources, indicated here as local DC supplies (8) being solar Photovoltaic panel (9) in this instance, which may provide power prior to inversion, or alternatively from local grid supply (10) via a consumer unit circuit (11) and smart meter (12) connected to a grid supply (13), where said consumer unit (11) is shown here also powering AC circuits such as AC sockets (14) and AC lighting circuits (15), and said meter or consumer unit may also be in connectivity with local smart power systems (16) such as smart hubs, sensors, home area networks, and further connected to remote third party services (17) where a series of cloud base applications (18) or brokerage or ender services (19) and network participant demand needs (20) are accessible, where said connectivity on the smart battery assembly, is also in preferred connectivity with said services 17 and resources 18, 19, 20, and is in preferred connectivity locally with smart meter 12, or via measurement sensors 21 and may be in local connectivity to heating systems in the household 22 such as heat storage, thermostats or boiler controls, and may be in local connectivity to smart appliances 23 in the household or retrofit appliance controls 24, as well as to smart control sensors on lighting circuits 25 or on smart light drivers or bulbs 27, or smart socket hubs 26 or smart sockets such as USB Power delivery sockets 28, where consumer devices illustrated here as a smart phone 29 and laptop 30 may be connected to receive DC power at the appropriate voltage, and may also be used as consumer displays to access web pages or data provided by said smart battery assembly (1) or view services and data provided by third party services 17. Wherein said overall system of selected parts forms a local node of a smart battery assembly, acting as a local hub for local demand monitoring and control, and local power supply for DC loads, and can provide storage charging or demand shift or demand control services in aggregate when coupled with a plurality of such systems deployed across a distribution network for the benefit of network management and service demand needs 20.

Figure 2:
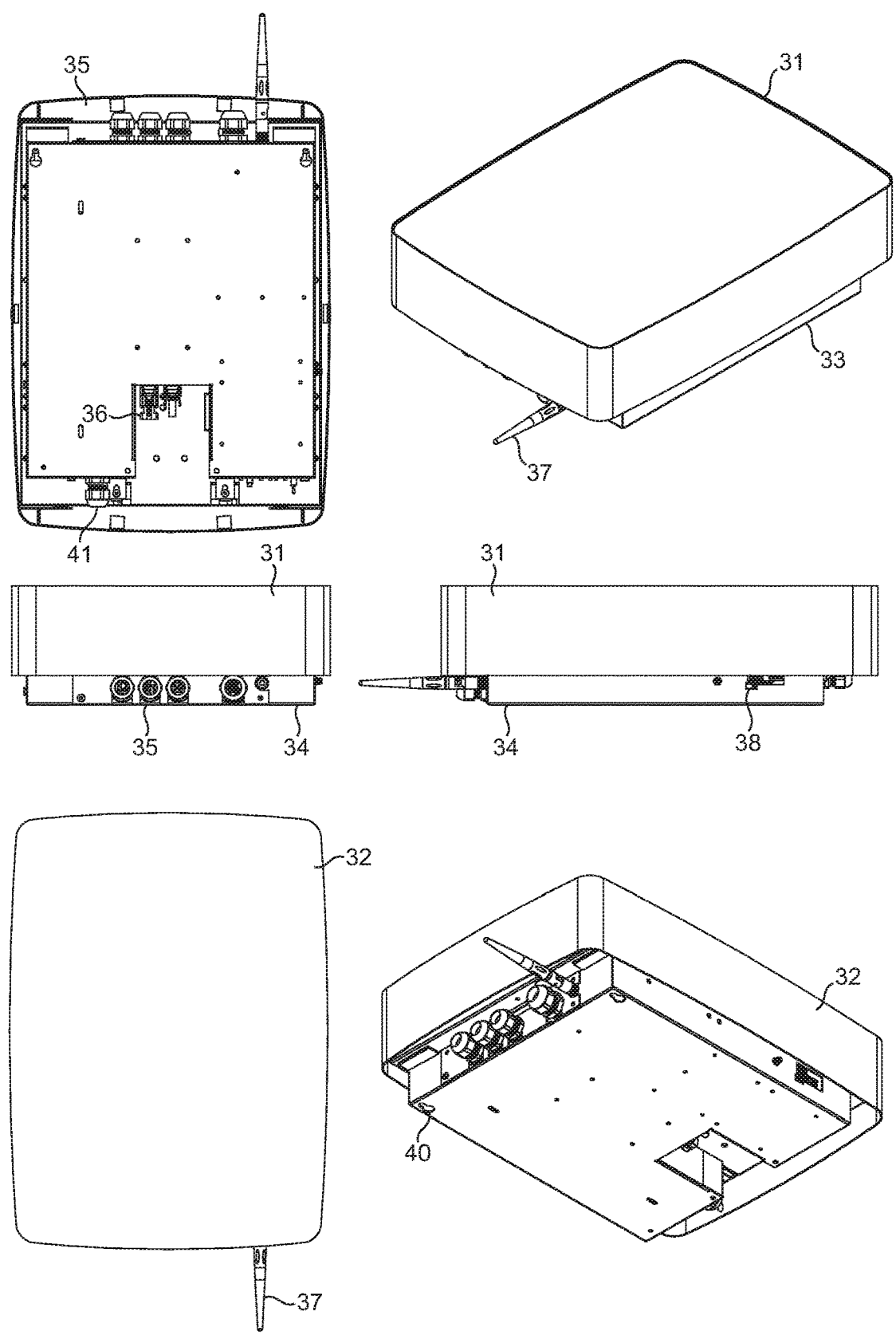
FIG. 2 provides a 3D axonometric view of a preferred embodiment of a smart battery assembly formed of a rear assembly supporting electronics, power delivery and smart control systems, and a front unit comprising battery storage, suitable for mounting on a wall, together with side and plan views.

Referring now to FIG. 2 which shows in axonometric views, front, sides and rear views of a preferred embodiment of a smart battery assembly (1) showing a preferred mechanical frame assembly (2) comprising a front battery assembly casing (31) with cover (32) and battery frame casing (33) and rear assembly frame (34), where in a series of connectors are shown for DC power delivery (35), inbound DC power supply (36), inbound AC mains supply (41), communications aerial (37), data connectivity (38), control panel display and switches (39). Where said smart battery assembly (1) could be mounted onto a surface or a wall by means of brackets or bolt positions (40).

Figure 3:
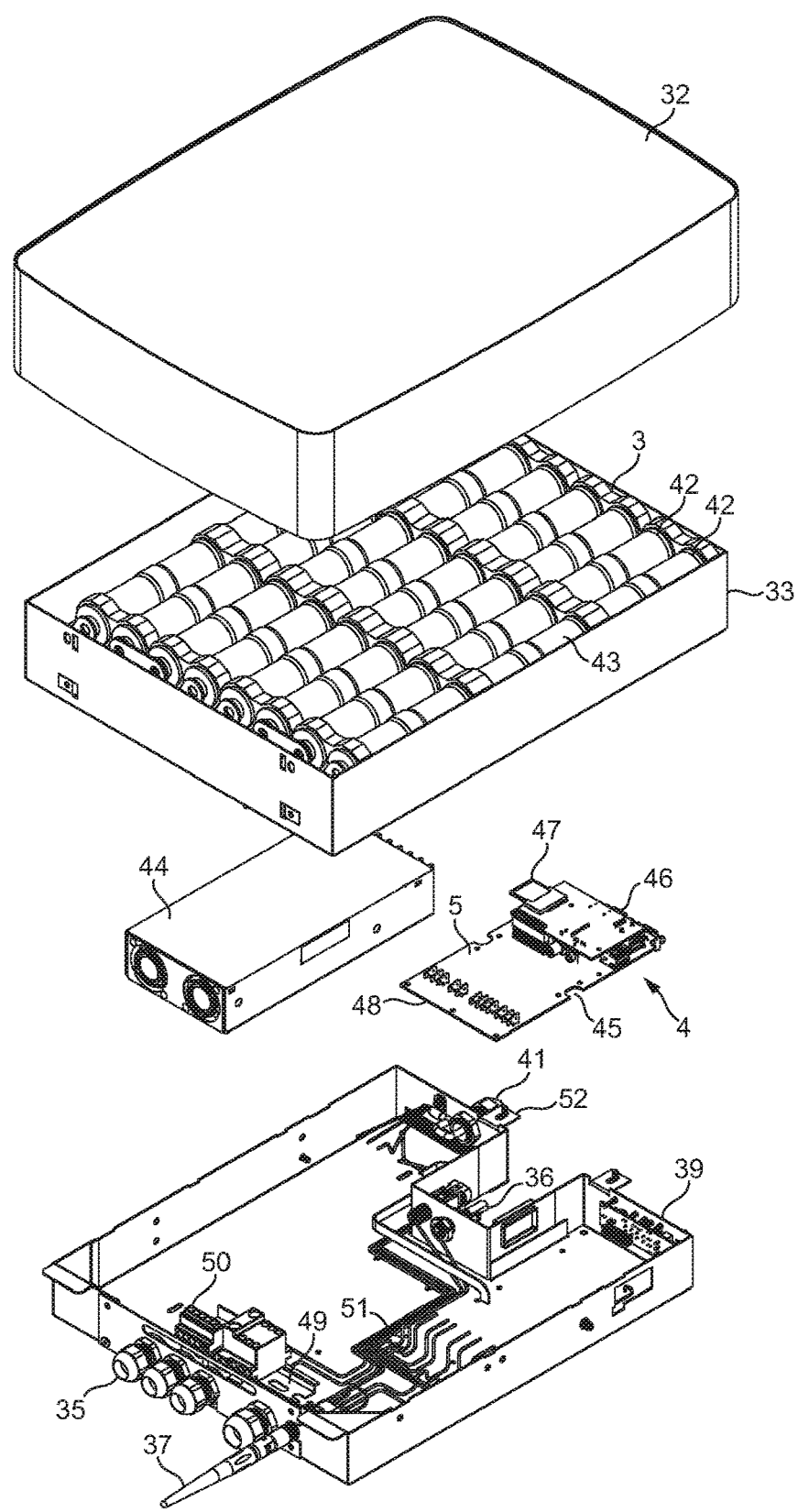
FIG. 3 provides a 3D axonometric explosion view of a preferred embodiment of a smart battery assembly showing the various layers, from rear assembly; supporting aerial, connection means for local DC circuits, DC supplies, AC mains supply, control/display board, slots for data connectivity, DIN rail for mounting internal connectors, switchgear, place for affixing an efficient AC/DC power supply, and smart control electronics; together with front mechanical assembly for supporting a plurality of battery units together with local safety circuitry, with front assembly cover, where said overall unit could be placed, mounted onto a suitable surface, rack or wall.

Referring now to FIG. 3 which shows an axonometric vertical exploded view of the sub-elements of the preferred mechanical frame assembly (2) showing the battery frame cover (32), battery frame casing (33), containing electrical storage (3) shown here as an example battery pack comprised of multiple cylinders (42) made of individual sub-cell battery units (43), but could be formed by a range of alternate pack formats such as prismatic forms, across a variety of chemistries, such as NimH, LiFEPO4, Lithium Ion, Sodium based or other chemical packs. And where said rear frame assembly (34) is shown with similar DC power connectors or wire sealers 35, aerial 37, AC inbound connector 41 and display indicator sub board 39, and where said rear frame is shown to support a DIN Rail 49 which indicatively shows a series of connector blocks 50, and where an example efficient AC/DC sub unit (44) is shown along with a smart control unit 4 is shown comprised in an example embodiment of a PCB 45 supporting power electronics controls and communication device 5 together with power connector points 48 for internal wiring indicated by 51 to DIN rail, DC Connector points, aerials, and supporting a modular sub-board 46 shown in this instance as a Raspberry PI unit, supporting data storage device 47 and other local data connectivity 38, and other communication device 5, where additional smart control or modular boards could be mounted in side said rear mechanical frame, or connected in proximity to the unit. Said overall smart battery assembly 2 being generally separable into the rear and front frame units for assembly, mounting on wall, maintenance or upgrading and replacing sub-units (e.g. replacing the entire front assembly battery pack module)

Figure 4:
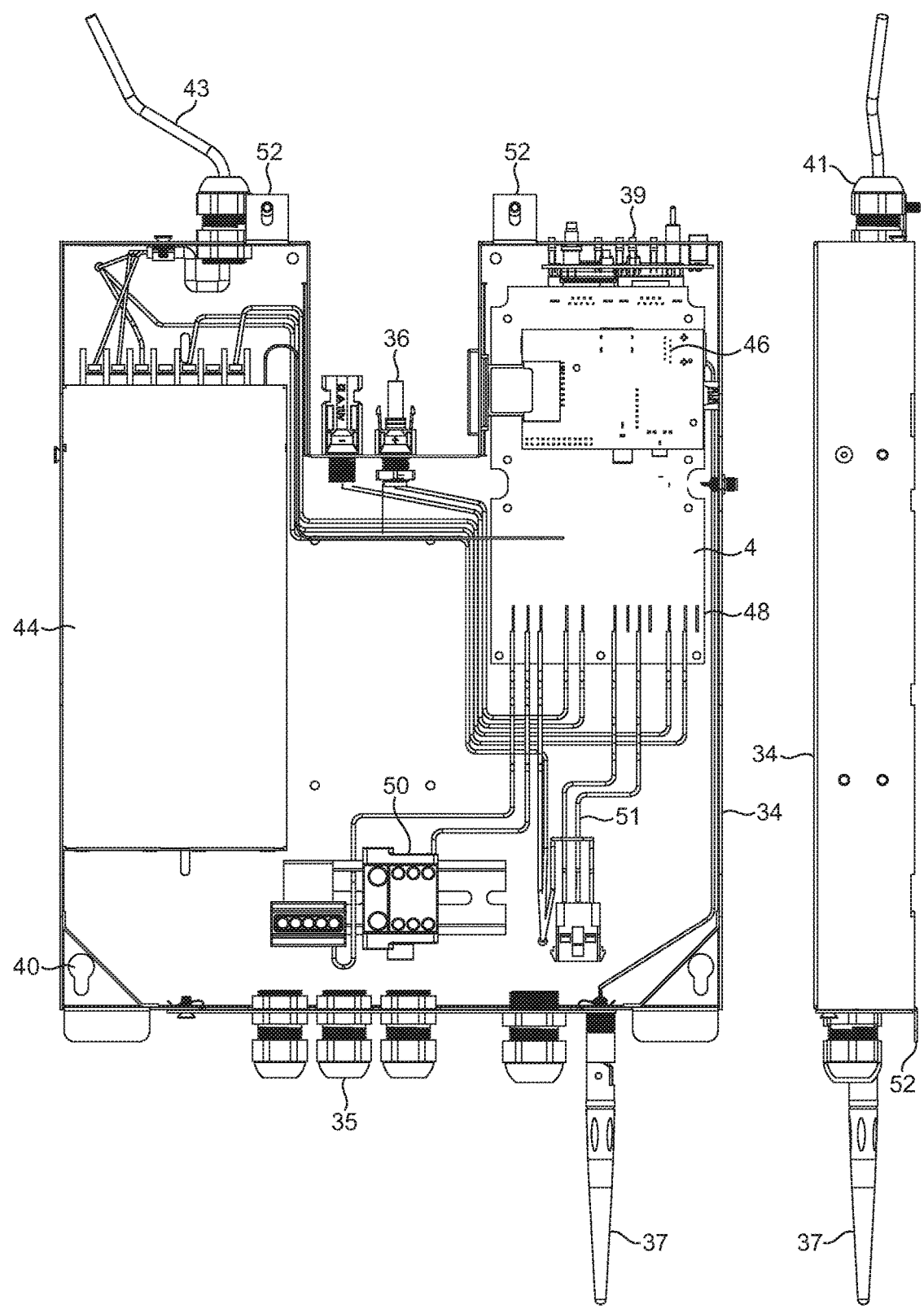
FIG. 4 provides a more detailed plan view of the rear assembly of a preferred embodiment of a smart battery assembly, showing the mains supply and AC/DC power supply, Smart control board, and internal connectors on DIN Rail, together with side view.

Referring now to FIG. 4 which shows a more detailed plan and side view of the typical elements comprising the rear frame showing example fixtures 52 to secure the front battery assembly and fastening points 40 to secure the rear frame to a surface or wall.

Figure 5:
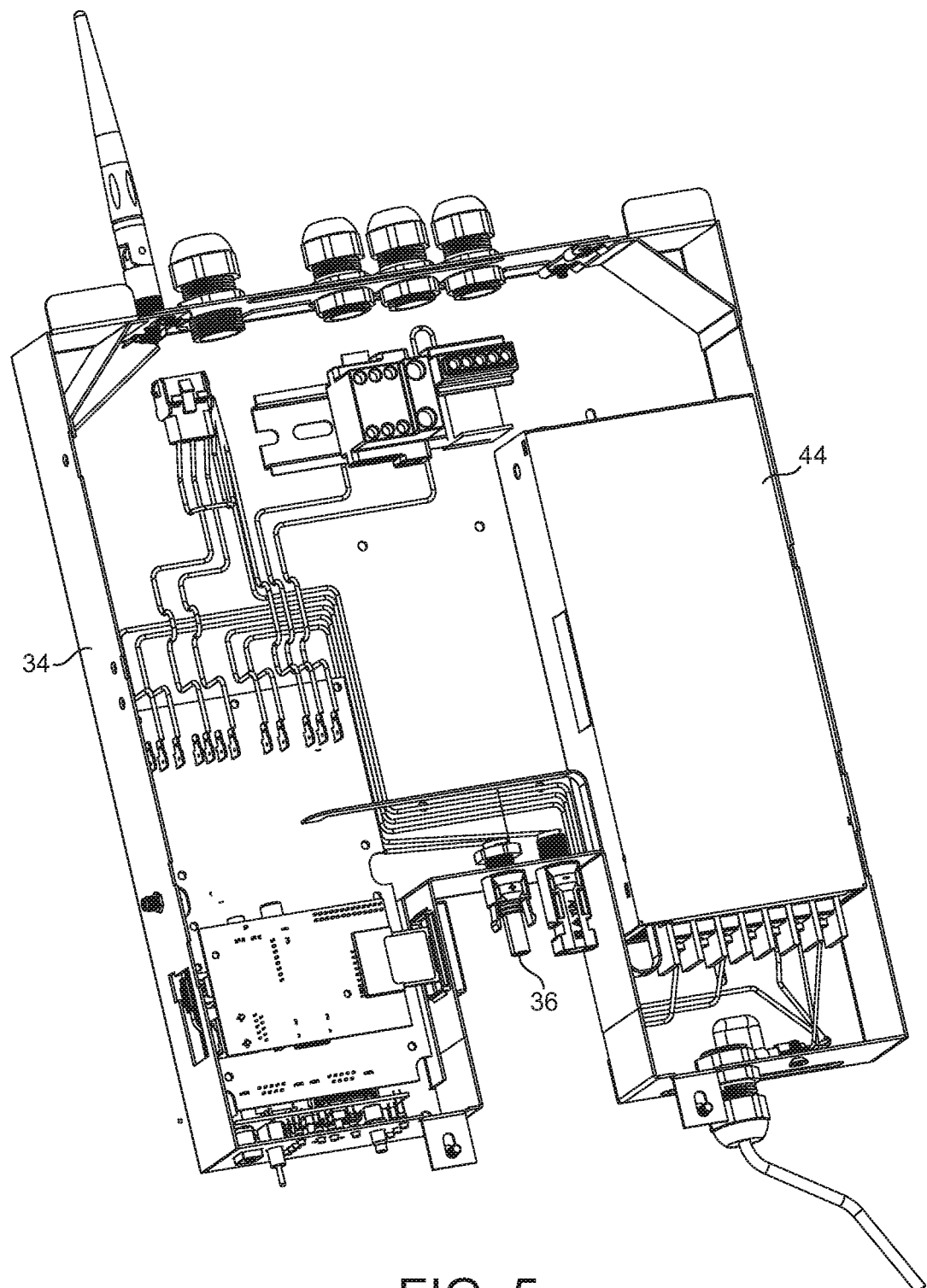
FIG. 5 provides an axonometric view of the rear assembly showing in more detail the structure of connectors, DIN rail and connector blocks, power supply internal wiring, smart control board, sub board supporting additional control functionality, external connectors such as USB, RS232 and Ethernet connectors, Data card slot, and display board with LED indicators and switches.

Referring now to FIG. 5 which shows an enlarged detailed axonometric view of the rear frame assembly shown in FIG. 4.

Figure 6:
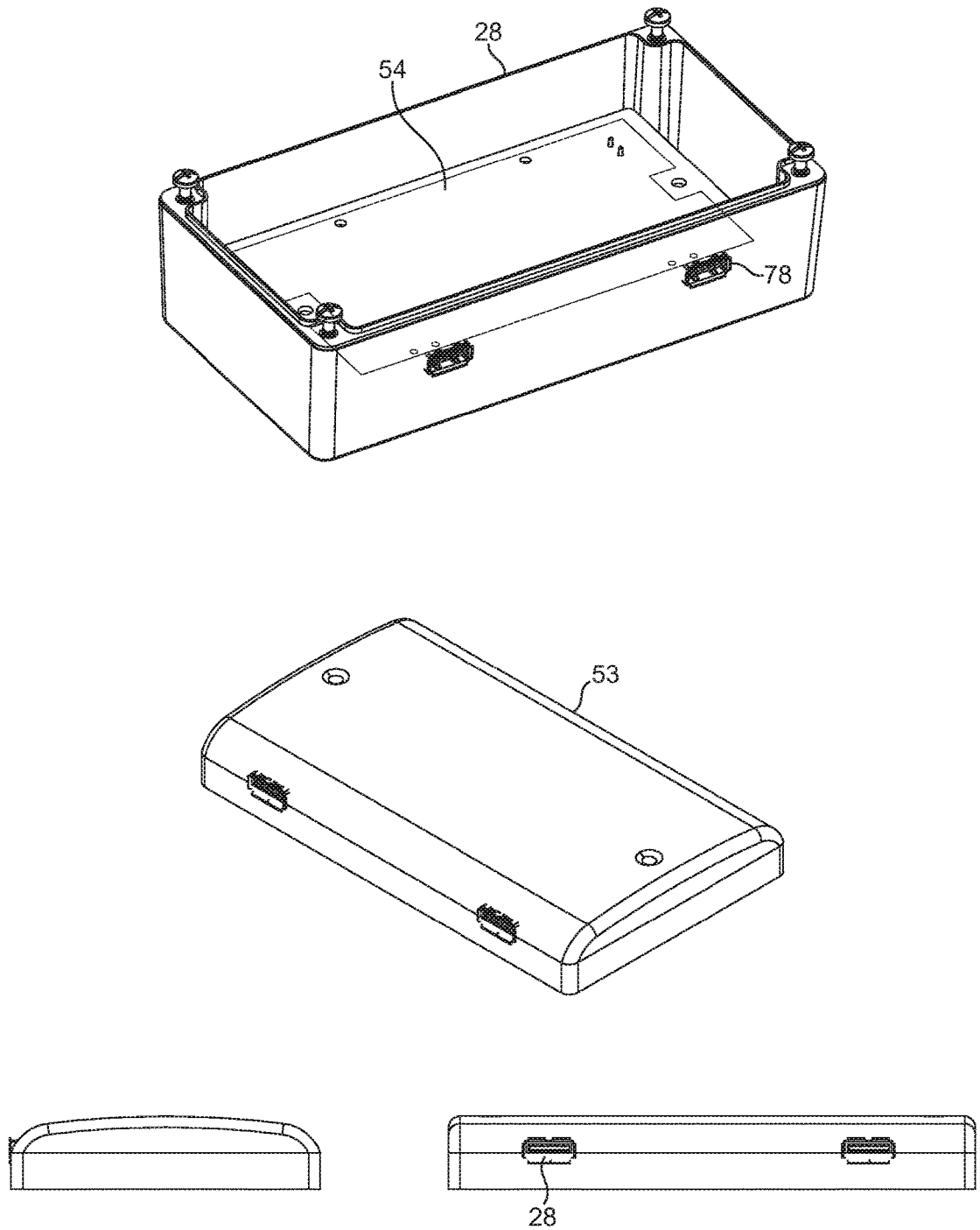
FIG. 6 provides a 3D axonometric view of an example DC Socket enclosure supporting an internal PCB control circuit for power delivery via USB Socket, together with example front face plate.

Referring now to FIG. 6, which shows an example axonometric view of a DC Socket hub 26, supporting DC sockets 28, and a more compact face plate 53 together with DC sockets 28 shown in corresponding side views, where said DC socket hub 54 typically contains power circuitry for receiving power from a preferred local DC supply circuit 7, or from a local AC/DC supply, and preferably implements a USB Power Delivery host or enumeration means for recognizing power delivery requirements, and suitable power circuitry to provide such as power requirement, where said DC socket hubs may be connected on DC supply circuits 7 or optionally on circuits connected to light circuits 6.

Figure 7:
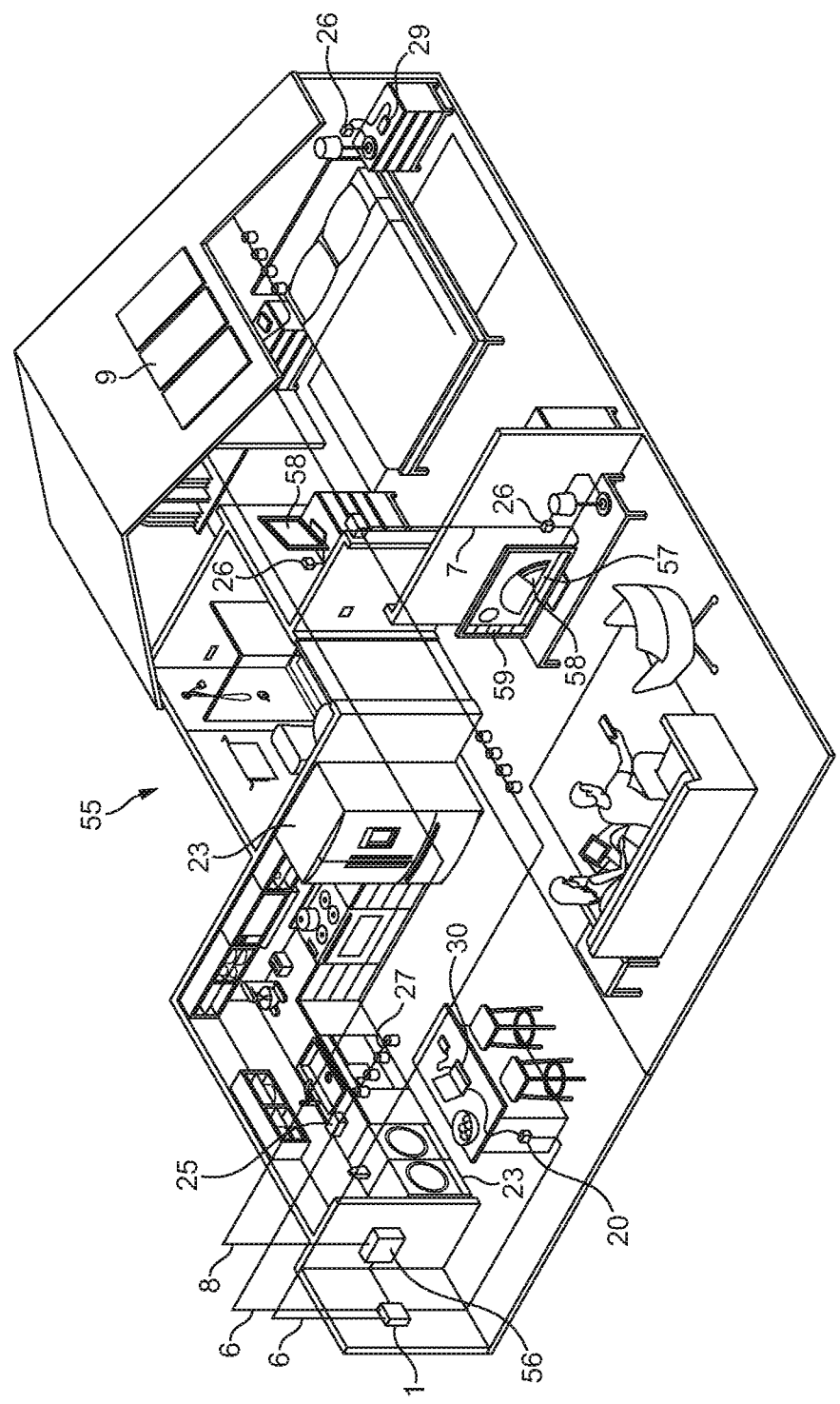
FIG. 7 provides an overall indicative schematic showing how such a smart battery assembly could be installed in a household providing a series of DC circuits using lighting circuit to provide DC lighting in various rooms, together with DC sockets in rooms for powering local DC appliances via smart sockets. The schematic also shows an example DC supply being solar panels connected into an inverter.

Referring now to FIG. 7 where an indicative schematic of how a smart battery assembly (1) might be deployed in a household context 55, where a series of indicative lighting circuits are shown 6 supporting local branches 7 for DC sockets 26, powering a plurality of example DC loads, such as laptops 30, smart phones 29, audio-visual equipment 57, DC LED televisions 58, as well as DC Light fittings 27 and also supporting smart lighting control units 25 that might measure or allow local light controls, where a local DC supply 8 is shown from solar panels 9 via an inverter and meter unit 56 which might itself be accessible to said battery assembly (1) DC outputs to provide a local inversion to allow AC demands in the household to use battery storage (3). In a preferred implementation the smart battery assembly might be installed as a retrofit re-using existing household wiring for lighting circuits 6 without by changing and swapping out corresponding downstream devices, lighting, and local addition of wiring for specific DC socket locations. FIG. 7 also shows an indicated energy display 58 showing real-time energy use on both the AC meter and on the DC network, together with indicative links 59 for energy advice or savings recommendation or other smart controls and data pages.

Figure 7B:
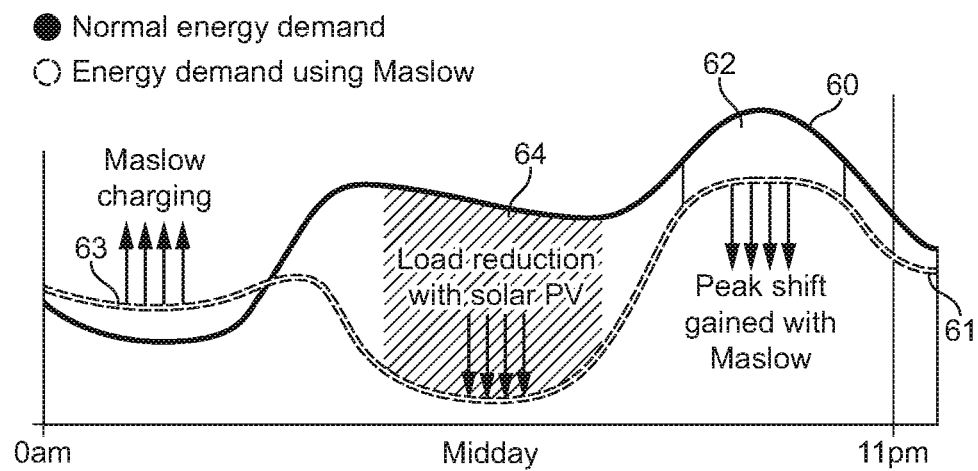
FIG. 7B shows an indicative schematic of a grid-shift where a normal energy demand profile is reduced through a combination of energy reductions, such as LED lighting, and shifting demand to batteries charged off peak or from renewables, or directly to supply from local PV resources.

Referring now to FIG. 7b which shows an indicative schematic graph of a typical household energy demand profile 60 and an indicated reduced and shifted profile 61 enabled by the smart battery assembly or MAS-LOW system, of meter attached storage and Low power delivery, whereby said electrical storage may be charged on an algorithm at off-peak times such as at night 63, and provide power with a bias during peak period 62 to enable an assured energy reduction, as a combination of actioned energy efficiency changes (such as installing DC LED lighting or DC appliances) and powering such demand at the peak time from energy stored in the batteries, where in if the household also has solar, said solar resources could be used to further charge the batteries during times of excess solar production 64, or to provide solar power directly over a DC network to base DC lighting and electronics load during the day. Said overall smart battery assembly and power delivery system thereby providing a technical approach to enable users to continue to use DC load when they want to, but be powered automatically from time shifted resources, and enabling new smart tariff models that aid such a system, such as peak price increases and off-peak reductions combined with automation to ensure that net peak price is offset by reduced peak demand from the AC grid by power from the local DC grid enabled by said batteries. Said networks of smart batteries systems would aggregate to provide a similar demand shift and peak reduction profile across multiple systems, and provide alternative charging modes than off peak 63 dynamically based on grid requirements 20, brokerage models 19, and applications 18. For example similar to charging from local renewable resources 64, said overall systems could be configured on demand to charge at times of peak wind production.

It will be appreciated that whilst the description and figures of preferred embodiments describes in detail a preferred mechanical assembly, and series of approaches and systems, said mechanical frames could be varied, and said control systems could support alternate models of charging or demand side management, shifts, or algorithms for intelligent charging and demand reduction. Similarly while the innovations have been described with reference to household deployment, such systems could be deployed into commercial spaces, to power lighting and ICT load, and enable a similar leverage of onsite renewables or grid shifted resources, as well as supporting detailed demand side monitoring and control. It will be further appreciated that whilst innovations have been described leveraging grid networks as a power supply, such systems could be deployed, and would be very advantageous in areas of poor or intermittent grid networks, to provide a security of supply or a balancing system to use and store energy when available for later power supply over DC loads, and similarly such systems could deployed totally off grid in homes and cabins or in self-contained sites like military basis, tents or vehicles, transport devices, and leisure units such as caravans, boats. It will also be appreciated that said deployments could be made into apartment blocks of hotel rooms, providing local DC networks for powering rooms, or flats, which can have a much higher proportion of DC devices and fewer needs for local AC networks or sockets.

Embodiments of the present disclosure have been described with particular reference to the examples illustrated. However, it will be appreciated that variations and modifications may be made to the examples described within the scope of the present disclosure.

What is claimed is:

1. A network comprising a plurality of battery assemblies in a power distribution network, the power distribution network comprising plural local branches, wherein each battery assembly is associated with a respective different building and:
    comprises power storage, control electronics and communication means; and, is configured to:
    I) act as a DC power supply for DC loads or AC loads via an inverter in a building with which that battery assembly is associated;
    II) charge the power storage;
    III) sink or source power to/from the power distribution network;
    wherein the plural battery assemblies are configurable as plural subsets of the plurality of battery assemblies each subset being a cluster on a respective local branch or branches of the power distribution network, wherein each subset is configured to be managed independently of other subsets as a collective resource in aggregate via a signal received from a remote server via the said communication means, to provide grid storage services or demand management services by sinking or sourcing power to/from the respective local branch of the power distribution network in accordance a predetermined requirement on said local branch.

2. A system according to claim 1, wherein charging of battery assemblies in a cluster is scheduled based on expected demand particular to that local branch based on time of day.

3. A system according to claim 1, wherein charging of battery assemblies in a cluster is based on availability of local distributed generation resources connected to the same branch of the distribution network, wherein the local distributed generation resources are selected from one or more of: backup-generators, waste to energy, PV arrays and wind energy, such that the battery assemblies are charged during a period where local distributed generation resources on the branch exceed load local demand so as to provide power for peak local load demand.

4. A system according to claim 1, wherein the local cluster is controlled to provide an assured peak power reduction at peak period to reduce investment or infrastructure upgrade requirements of the local branch.

5. A system according to claim 1, wherein the system enables local branches to leverage excess local clustering and supply of Photovoltaic PV export on the local branch.

6. A system according to claim 1, wherein the system is arranged to optimize energy resilience at times of network failure, by keeping online or prioritizing essential DC demand requirements in line with stored energy or knowledge of availability of local DC generation supplies.

7. A system according to claim 1, wherein the battery assembly acts as a local hub for local DC power demand monitoring within a local DC network.

8. A system as claimed in claim 1 wherein the control electronics comprises an algorithm for charging and/or DC power demand management.

9. A system as claimed in claim 1 wherein at least one battery assembly is configured to receive a demand management signal or demand request.

10. A system as claimed in claim 1 configured to schedule the charging of the battery assemblies in accordance with a demand from local end users.

11. A system as claimed in claim 10 configured to schedule the charging of the battery assemblies based on power usage measurements.

12. A system as claimed in claim 11 wherein the charging is further scheduled dependent upon the availability of power generation resources.

13. A system as claimed in claim 12 wherein the charging is further scheduled dependent upon the export of power from power generation resources.

14. A system as claimed in claim 13 wherein the power generation resources comprise any of:
    I) photovoltaic resources;
    II) wind generation
    III) fuel cells;
    IV) combined heat power electrical generation;
    V) building fabric technology capable of generating DC power; and
    VI) DC scavenging technologies.

15. A system as claimed in claim 1 configured to selectively only supply power to a subset of connected DC loads.

16. A system as claimed in claim 1 configured to:
    I) determine the profile and type of end device power usage; and,
    II) manage the end device.

17. A system as claimed in claim 16 wherein the determination of the profile and type of end power usage comprises the use of USB power delivery via a DC socket.

18. A system as claimed in claim 17 wherein, to manage the end device, the system is configured to:
    I) report maximum and minimum power load,
    II) switch off or put the end device into standby when not used, and
    III) defer the charging of a battery on said end device.

19. A system as claimed in claim 1 configured to detect a cluster of end power use and correlate power supply activities across associated power sockets.

20. A system as claimed in claim 19 configured to:
    I) be connected to a series of DC sockets;
    II) receive power usage data from the series of DC sockets
    III) determine when an end device and a connected peripheral device are in use; and
    IV) switch off the DC power or switch to standby the peripheral device when the end device is not in use.

21. A method of providing local grid storage services or demand management services in a system comprising a plurality of battery assemblies in a power distribution network, the power distribution network comprising plural local branches, wherein each battery assembly is associated with a respective different building and:
- comprises power storage, control electronics and communication means; and, is configured to:
- I) act as a DC power supply for DC loads or AC loads via an inverter in the building with which that battery assembly is associated;
- II) charge the power storage,
- III) sink or source power to/from the power distribution network; the method comprising configuring the plural battery assemblies as plural subsets of the plural battery assemblies, each subset being a cluster on a respective local branch or branches of the power distribution network; providing a signal from a remote server to a particular subset of the plurality of battery assemblies, wherein the signal is configured to manage the subset of battery assemblies independently of other subsets as a collective resource in aggregate to provide grid storage services or demand management services by sinking or sourcing power to/from the respective local branch of the power distribution network in accordance with a predetermined requirement on said local branch.

* * * * *